United States Patent
Kanne et al.

[11] Patent Number: 6,140,576
[45] Date of Patent: Oct. 31, 2000

[54] PROTECTIVE SHIELD TENT AND METHOD OF USING SAME

[75] Inventors: Mark Melvin Kanne, Chandler; Ian Mark Whiting, Tempe, both of Ariz.

[73] Assignee: Motorola, Inc., Schaumburg, Ill.

[21] Appl. No.: 09/055,456

[22] Filed: Apr. 6, 1998

[51] Int. Cl.[7] .................................................. H05K 9/00
[52] U.S. Cl. ...................... 174/35 R; 135/139; 135/156; 135/909; 135/136; 52/2.11; 52/2.13; 442/131; 296/168
[58] Field of Search ................................. 135/139, 156, 135/909, 115, 136; 52/2.11, 2.13, 2.18; 296/168; 174/35 R, 35 MS; 342/4, 1, 165; 442/131

[56] References Cited

U.S. PATENT DOCUMENTS

| | | | |
|---|---|---|---|
| 3,969,572 | 7/1976 | Rostek | 174/35 MS |
| 4,149,748 | 4/1979 | Tannet | 296/168 |
| 5,134,405 | 7/1992 | Ishihara et al. | 342/1 |
| 5,534,873 | 7/1996 | Weichmanetal | 342/512 |
| 5,739,463 | 4/1998 | Diaz et al. | 174/35 MS |
| 5,761,054 | 6/1998 | Kuhn | 361/818 |
| 5,901,727 | 5/1999 | Kramer et al. | 135/136 |
| 5,903,473 | 5/1999 | Kupperman et al. | 364/512 |
| 5,908,043 | 6/1999 | Paes et al. | 135/139 |
| 5,917,708 | 6/1999 | Moran et al. | 361/800 |
| 5,918,615 | 7/1999 | Stuck, Sr. | 135/135 |
| 5,927,311 | 7/1999 | Jager | 135/124 |
| 5,987,822 | 11/1999 | McNiff et al. | 52/2.11 |
| 6,012,505 | 1/2000 | Wurz et al. | 160/66 |
| 6,013,586 | 1/2000 | McGee et al. | 442/131 |
| 6,017,081 | 1/2000 | Colby | 296/173 |

*Primary Examiner*—William A. Cuchlinski, Jr.
*Assistant Examiner*—Ronnie Mancho
*Attorney, Agent, or Firm*—Frank J. Bogacz; James E. Klekotka

[57] ABSTRACT

Protective shield tent (100, 300, 400) provides a portable and repeatable method for protecting assemblies during various stages of a manufacturing process. Protective shield tent (100, 300, 400) is light weight and can be deployed manually. Protective shield tent (100, 300, 400) is simple to use and shortens the time required for a manufacturing process. The invention provides a simple, accurate, low-cost, and repeatable method for using a portable EMI shielding apparatus for protecting a component or large subassembly during various stages of a manufacturing process. A portable collapsible frame is provided along with a removable protective covering which is mounted over the collapsible frame to create an EMI shield around the component or subassembly. Protective shield tent (100, 300, 400) can easily be moved from one location to another facilitating re-use.

9 Claims, 4 Drawing Sheets

PROTECTIVE SHIELD TENT AND METHOD OF USING SAME

FIELD OF THE INVENTION

The present invention relates generally to the protection of components during a manufacturing process, and more particularly, to using permanent and semi-permanent protection devices to shield components during various steps in a manufacturing process.

BACKGROUND OF THE INVENTION

Traditionally, large components such as communication satellites have been extremely expensive and time-consuming to develop and assemble. One reason is because satellite and satellite payload specifications generally lead to complex products that require a high degree of reliability. In particular, design parameters require a minimization of the structural mass of the satellite in order to maximize both orbit-maintaining fuel carried by the satellite and launch vehicle fuel. Minimization of structural mass causes satellites to become delicate and susceptible to damage through mishandling.

Satellite technology has become increasingly more important in commercial applications. These applications for satellites frequently utilize an increased quantity of satellites. This has led to the use of satellite payloads which comprise a number of individual communication satellites and a dispensing mechanism. Technological advances have decreased satellite dimensions which leads to smaller physical sizes for satellite payloads. These decreases in size also make the satellite payloads more delicate and susceptible to damage through mishandling.

To efficiently utilize expensive manufacturing floorspace, multiple satellites are typically positioned relatively close together in an assembly line fashion. There is a need to minimize the amount of floorspace required for each of the delicate satellites. Traditional methods of protecting and/or covering satellites and/or payloads during the manufacturing process have been susceptible to human error. There are many opportunities during covering and uncovering procedures in which damage to delicate and expensive pieces of hardware can occur. The down-time associated with replacing damaged parts and/or repairing parts is far too costly for a commercially competitive environment.

Thus, what is needed is an apparatus for protecting large components while they are being manufactured and a method for using the apparatus during a manufacturing process. What is also needed is an apparatus for protecting individual pieces of a large component during various stages of a component's lifetime.

BRIEF DESCRIPTION OF THE DRAWINGS

A more complete understanding of the invention can be derived by referring to the detailed description and claims when considered in connection with the figures, wherein like reference numbers refer to similar items throughout the figures, and:

DETAILED DESCRIPTION OF A PREFERRED EMBODIMENT

The invention provides simple, portable, low-cost, and repeatable methods for using a protective tent shield to protect large components and/or subassemblies during a manufacturing process. The protective tent shield provides an apparatus for covering a large component with an EMI covering without damaging the delicate portions of the large component or damaging the EMI covering. The protective tent shield allows a protective covering to be used over and around a large subassembly such as a satellite payload.

In addition, a protective shield tent can be used to protect individual parts of a large component or subassembly. The protective tent shield allows a protective covering to be used over and around a portion of a subassembly such as a radio frequency (RF) subsystem on a satellite payload.

The EMI protective covering material is a composite material that can be damaged if not handled properly. Attaching the EMI protective covering material to a simple frame provides a means for minimizing the mishandling of the material. Desirably, the protective covering material comprises a metalized foil. In some situations, the protective covering material is held in place using its own weight, and this eliminates the need for additional mounting hardware such as eyelets. This also allows the protective covering to be easily installed and removed.

Figure 1:
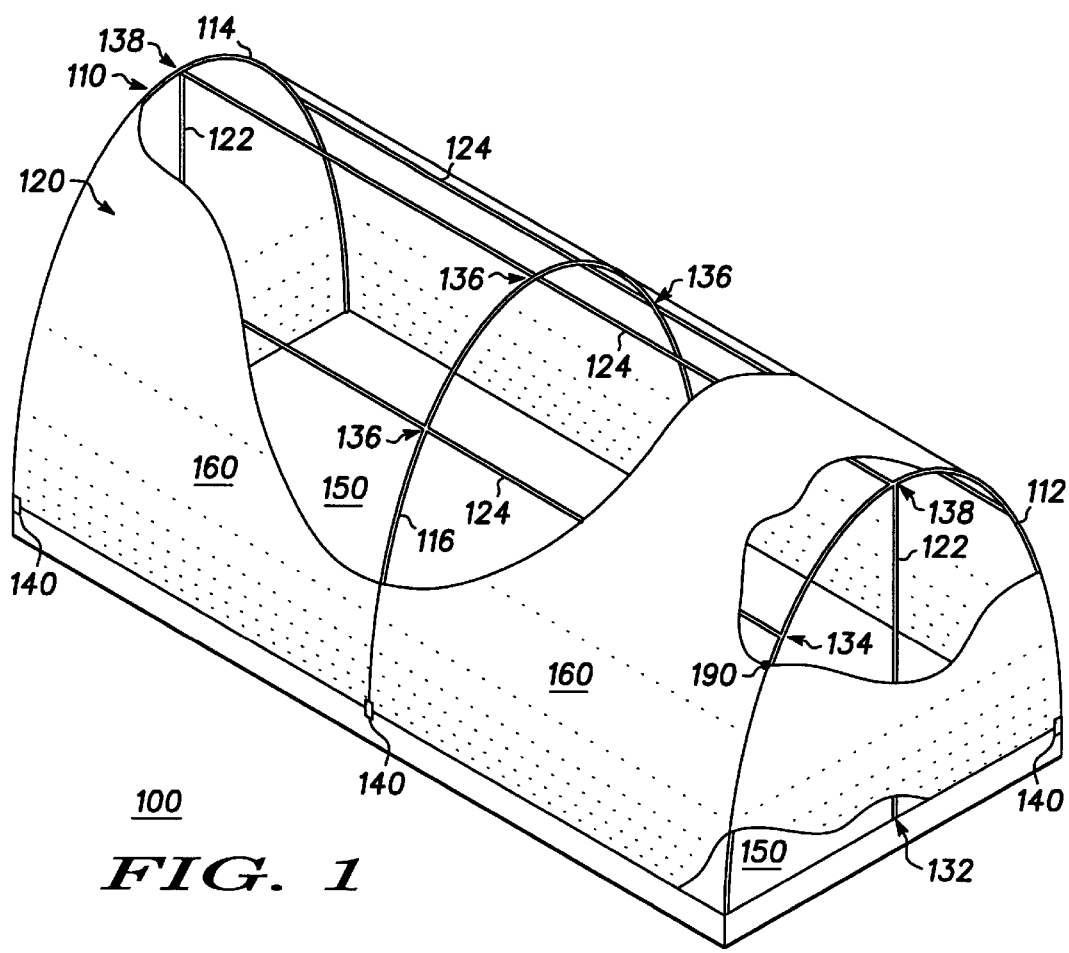
FIG. 1 shows a simplified view of a protective shield tent in accordance with a preferred embodiment of the invention.

FIG. 1 shows a simplified view of a protective shield tent in accordance with a preferred embodiment of the invention. Protective shield tent 100 comprises frame 110 and protective covering 120. FIG. 1 illustrates a cut-away view of protective shield tent 100.

In a preferred embodiment, at least two types of structural members 122 and 124 are used. Structural member 124 is desirably longer and shaped differently than structural member 122. Desirably, end point 132 on structural member 122 is in contact with the top surface of mounting plate 150. Desirably, end points 134 on structural member 124 do not contact mounting plate 150, but rather are attached to curved end members, such as 112 and 114. In other alternate embodiments, a number of different types of structural members 120 could be used having a variety of shapes, and they could be joined together in a number of different manners.

In a preferred embodiment, frame 110 comprises two curved end members 112, 114, and at least one curved center support member 116 that are joined together using structural members 122 and 124, although this is not required for this invention. In alternate embodiments, frame 110 could comprise any number of curved end members 112 and 114, any number of support members 116, and any number of structural members 122 and 124. In other embodiments, end members could be triangularly shaped.

In a preferred embodiment, at least one curved center support member 116 is used. Structural members 122 are attached to at least one curved end member 112, 114 as illustrated by point 138. Center support member 116 is attached to structural member 124 at point 136. Desirably, all members used to fabricate frame 110 are attached together. This allows frame 110 to be easily moved.

In alternate embodiments, a number of different types of center support members 116 could be used having a variety of shapes. For example, center support member 116 could be triangularly shaped. In addition, a number of different means could be used for joining the members together to form frame 110.

In a preferred embodiment, protective covering 120 is a metalized cloth which, among other things, provides both thermal and EMI protection, although this is not required for this invention. In alternate embodiments, protective covering 120 could comprise any number of different materials that provide other forms of protection such as protection from moisture.

In a preferred embodiment, frame 110 provides a means for supporting protective covering 120 without damaging it. Desirably, frame 110 is positioned over a group of components that have been attached to a mounting plate. For example, the group of components could be part of a satellite payload and the protective covering is draped over the frame to provide a thermal barrier. Frame 110 does not allow protective covering 120 to come in contact with the components that are being covered. In this manner, valuable assets such as components on satellite payloads can be protected from environmental conditions.

In a preferred embodiment, protective covering 120 is attached to frame 110 using at least one attachment device 190, although this is not required by this invention. Desirably, attachment device 190 is a tape that allows protective covering 120 to be attached and detached a number of times without damaging frame 110 or protective covering 120. In alternate embodiments, protective covering 120 is sewn to frame 110. In some cases, wire is used to establish a low resistance electrical path between protective covering 120 and frame 110.

In a preferred embodiment, protective shield tent 100 is held in place using at least one mounting device 140, although this is not required by this invention. Desirably, mounting device 140 is tape that allows protective shield tent 100 to be put in place and removed a number of times without damaging frame 110 or protective covering 120.

In alternate embodiments, mounting device 140 could comprise a number of different pieces that allow protective shield tent 100 to be attached to at least one surface on mounting plate 150 using various methods. For example, snap mechanisms can be used where one part of the snap mechanism is connected to cover 120 and the other part of the snap mechanism is connected to mounting plate 150. In some cases, one or more mounting devices can be provided to hold protective shield tent 100 in place. In these cases, a number of different procedures could be used that may or may not include additional parts. In alternate embodiments, protective shield tent 100 can be held in place using its own weight.

In a preferred embodiment, members 112, 114, 116, 122, and 124 are fabricated from light weight carbon fiber material that is conductive. In alternate embodiments, members 112, 114, 116, 122, and 124 could be fabricated from a number of different materials that can be non-conductive. In some embodiments, members 112, 114, 116, 122, and 124 could be fabricated from metallic and/or non-metallic materials. For example, Kapton or fiberglass rods could be used.

In alternate embodiments, members 112, 114, 116, 122, and 124 could comprise a number of pieces that are connected together using various methods. In this way, members 112, 114, 116, 122, and 124 could be easily assembled and/or disassembled.

In a preferred embodiment, protective covering 120 comprises an EMI shielding material. For example, the EMI shielding material can include a foil layer and a carrier layer such as a polyester. In alternate embodiments, protective covering 120 could be fabricated using any number of different materials such as cloth interwoven with various metallic threads.

In a preferred embodiment, protective covering 120 comprises a number of shaped panels 160 that are connected together, although this is not required for the invention. In alternate embodiments, protective covering 120 could be fabricated using a single piece of material that is shaped to conform to the shape established by frame 110.

The invention as illustrated in FIG. 1 is also applicable to other assembly operations that require a simple, low-cost method for protecting components. For example, protective shield tents can be used to provide, among other things, thermal barriers (blankets) around individual components.

In different embodiments, a protective shield tent is used to provide a temporary portable protective enclosure for space qualified hardware. In these cases, a protective shield tent can be used to provide EMI protection, among other things, for a satellite payload and/or satellite payload components and subassemblies as the satellite payload is being manufactured. For example, a manufacturing process may require these payloads and/or components to remain in an undesirable location such as a factory floor for a certain amount of time, and this means they must be protected as much as possible during this time.

Figure 2:
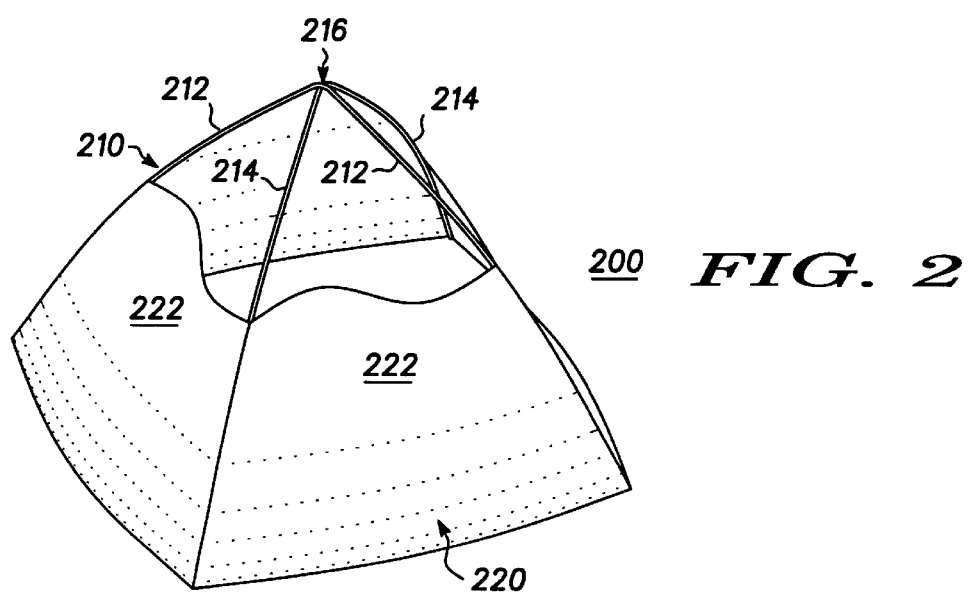
FIG. 2 shows a simplified view of a protective shield tent in accordance with a first alternate embodiment of the invention.
Figure 3:
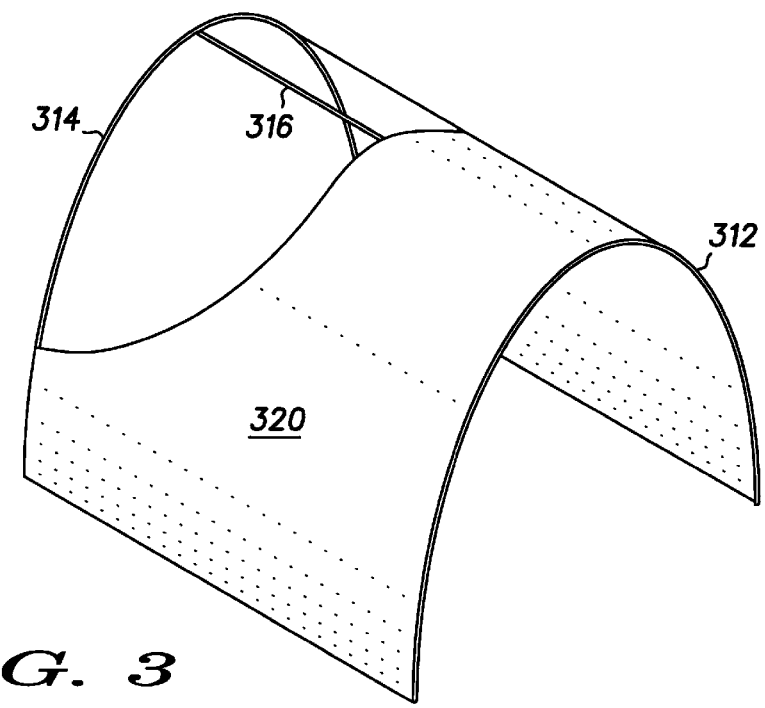
FIG. 3 shows a simplified view of a protective shield tent in accordance with a second alternate embodiment of the invention.
Figure 4:
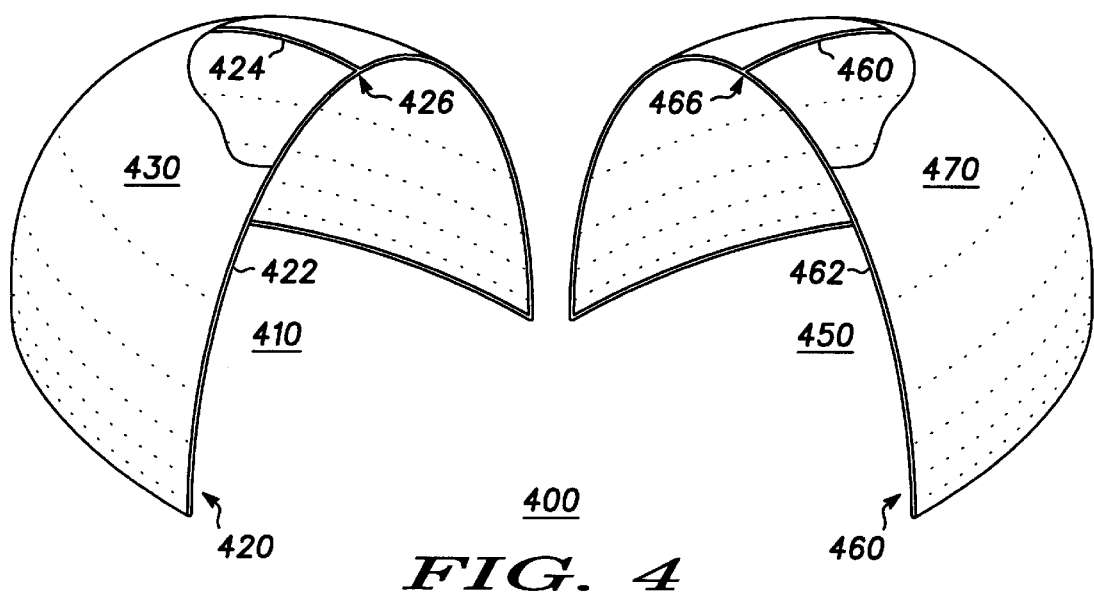
FIG. 4 shows a simplified view of a protective shield tent in accordance with a third alternate embodiment of the invention.

FIG. 2, FIG. 3, and FIG. 4 illustrate a number of typical applications for various embodiments of the invention. These figures show that the invention is applicable to a number of manufacturing operations and/or steps in a manufacturing operation in which large subassemblies must be protected from environmental conditions such as static electricity, dirt, dust, and moisture.

FIG. 2 shows a simplified view of a protective shield tent in accordance with a first alternate embodiment of the invention. Protective shield tent 200 comprises collapsible frame 210 and protective covering 220. FIG. 2 illustrates a cut-away view of protective shield tent 200.

In the first alternate embodiment, collapsible frame 210 comprises two curved structural members 212 and 214 that are joined together using flexible joint 216. In other alternate embodiments, a number of different types of structural members could be used having a variety of shapes. For example, structural members 212 and 214 could be triangularly shaped. In addition, a number of different means could be used for joining the structural members together.

In the first alternate embodiment, protective covering 220 is a metalized cloth which, among other things, provides EMI protection, although this is not required for this invention. In other alternate embodiments, protective covering 220 could comprise any number of different materials that provide other forms of protection such as protection from moisture.

In the first alternate embodiment, collapsible frame 210 provides a means for supporting protective covering 220 without damaging it. In a typical application, a frame is positioned around a component or large sub-assembly such as a satellite payload, and a protective covering is then draped over the frame. The frame does not allow the protective covering to come in contact with the component that is being covered. In this manner, valuable assets such as satellite payloads can be protected from environmental conditions.

In the first alternate embodiment, protective covering 220 is held in place using its own weight, although this is not required by this invention. In other alternate embodiments, protective covering 220 can be held in place using a variety of devices. For example, snap mechanisms can be used where one part of the snap mechanism is mounted on collapsible frame 210 and the other part of the snap mechanism is attached to protective covering 220. In some cases, one or more attachment devices can be provided to attach protective covering 220 to collapsible frame 210. In these cases, a number of different attachment procedures could be used that may or may not include additional parts.

In the first alternate embodiment, collapsible frame 210 comprises a first curved structural member 212 and a second curved structural member 214. In the first alternate embodiment, structural members 212, 214 are fabricated from light weight carbon fiber material. In other alternate embodiments, structural members 212, 214 could be fabricated from a number of different materials that can be metallic or non-metallic. In some embodiments, structural members 212, 214 could be fabricated from a number of different materials that can be conductive or non-conductive. For example, fiberglass rods could be used.

In the first alternate embodiment, structural members 212, 214 are collapsible and include a means for folding, although this is not required for the invention. In other alternate embodiments, structural members 212, 214 could comprise a number of pieces that are connected together using various methods. In this way, structural members 212, 214 could be easily assembled and/or disassembled. Desirably, structural members 212, 214 when assembled have a known shape.

In the first alternate embodiment, protective covering 220 comprises an EMI shielding material. For example, the EMI shielding material can include a foil layer and a carrier layer such as a polyester. In other alternate embodiments, protective covering 220 could be fabricated using any number of different materials such as cloth interwoven with various metallic threads. In these cases, the material is typically non-transparent.

In other embodiments, protective covering 220 is manufactured using at least one plastic material. Typically, the plastic material is flexible and transparent.

In the first alternate embodiment, protective covering 220 comprises a number of shaped panels 222 that are connected together, although this is not required for the invention. In other alternate embodiments, protective covering 220 could be fabricated using a single piece of material that is shaped to conform to the shape established by collapsible frame 210.

In the first alternate embodiment, collapsible frame 210 comprises two structural members, although this is not required for the invention. In this case, the two structural members can be positioned into at least two different configurations (shapes). The first configuration is established to minimize the space required to store the frame such as in a factory. The second configuration is established to minimize the space required when the protective shield tent is deployed such as on a factory floor during a manufacturing process. In this second configuration, the protective shield tent is providing a temporary protective enclosure for a subassembly.

In the first alternate embodiment, flexible joint 216 is used to couple a first structural member and a second structural member together into a frame. In this case, the flexible joint allows the first structural member and the second structural member to move in at least one dimension with respect to each other, and this allows at least two different shapes to be configured.

FIG. 3 shows a simplified view of a protective shield tent in accordance with a second alternate embodiment of the invention. FIG. 3 illustrates a cutaway view of protective shield tent 300. In this case, protective shield tent 300 comprises collapsible frame 310 and protective covering 320. In other alternate embodiments, non-collapsible frames could be used.

In the second alternate embodiment, collapsible frame 310 comprises two curved structural members 312 and 314 that are joined together using a plurality of separator arms 316. In other alternate embodiments, a number of different types of structural members 312 and 314 could be used having a variety of shapes.

In the second alternate embodiment, protective covering 320 is a metalized cloth that provides, among other things, EMI protection. In other alternate embodiments, protective covering 320 could comprise any number of different materials that provide other forms of protection such as protection from moisture.

In the second alternate embodiment, collapsible frame 310 provides a means for supporting protective covering 320 without damaging it. In an exemplary application, collapsible frame 310 is positioned around a large component or sub-assembly such as a satellite payload, and protective covering 320 is then draped over the frame. Separator arms 316 along with structural members 312 and 314 are used to prevent protective covering 320 from coming in contact with the component that is being covered. In this manner, valuable assets such as satellite payloads can be protected from environmental conditions.

In the second alternate embodiment, protective covering 320 is held in place using its own weight. In other alternate embodiments, protective covering 320 can be held in place using a variety of devices. For example, snap mechanisms can be used where one part of the snap mechanism is mounted on collapsible frame 310 and the other part of the snap mechanism is attached to protective covering 320. In some cases, one or more attachment devices can be provided to attach protective covering 320 to collapsible frame 310. In these cases, a number of different attachment procedures could be used that may or may not include additional parts.

In the second alternate embodiment, collapsible frame 310 comprises a first curved structural member 312 and a second curved structural member 314. Structural members 312, 314 are fabricated from light weight carbon fiber material. In other alternate embodiments, structural members 312, 314 could be fabricated from a number of different materials that can include metallic and non-metallic materials and/or conductive and non-conductive materials.

In the second alternate embodiment, structural members 312, 314 are collapsible and include means for folding. In other alternate embodiments, structural members 312, 314 could comprise a number of pieces that are connected together using various methods. In this way, structural members 312, 314 could be easily assembled and/or disassembled. Desirably, structural members 312, 314 when assembled along with separator arms 316 provide collapsible frame 310 with a known shape.

In the second alternate embodiment, five separator arms 316 are used to connect structural members 312 and 314 together to form collapsible frame 310. In other alternate embodiments, any number of different types of separator arm 316 could be used for joining the structural members together to establish collapsible frame 310. In additional alternate embodiments, separator arms 316 can have different lengths In the second alternate embodiment, protective covering 320 comprises a single piece of material that is shaped to conform to the shape established by collapsible frame 310. In other embodiments, protective covering 320 could comprise a number of shaped panels that are connected together. In additional embodiments, protective covering 320 could be fabricated using a single piece of material that is rectangularly shaped, and it is draped over collapsible frame 310. In some cases, protective shield tent 300 can be open-ended.

In the second alternate embodiment, protective covering 320 comprises an EMI shielding material. For example, the EMI shielding material can include a foil layer and a carrier layer such as a polyester. In other alternate embodiments, protective covering 320 could be fabricated using any number of different materials such as cloth interwoven with various metallic threads.

In other alternate embodiments, at least one mobility arrangement is provided. A mobility arrangement is a device that allows a protective shield tent to be easily moved once it is positioned. A mobility arrangement can include wheels and/or skid plates and can be attached to end points on the structural members. For example, this would allow a protective shield tent to be easily moved around in a manufacturing area. In some cases, a set of mounting hardware could be used to attach the mobility arrangement to structural members.

FIG. 4 shows a simplified view of a protective shield tent in accordance with a third alternate embodiment of the invention. Protective shield tent 400 comprises first portable section 410 and second portable section 450. FIG. 4 illustrates a cut-away view of first portable section 410 and second portable section 450.

In an exemplary application, first portable section 410 is positioned around a first portion of a large subassembly such as a satellite payload. Next, second portable section 450 is positioned around a second portion of the subassembly. Then, first portable section 410 is connected to second portable section 450, and in this manner, the subassembly is enclosed in a protective shield tent.

In the third alternate embodiment, first portable section 410 comprises a first collapsible frame 420 and a first protective covering 430. In this case, second portable section 450 comprises a second collapsible frame 460 and a second protective covering 470. In addition, second portable section 450 is slightly larger than first portable section 410, and this allows the two sections to be positioned together to form protective shield tent 400.

In the third alternate embodiment, first collapsible frame 420 comprises two curved structural members 422 and 424 that are joined together using a first flexible joint 426. In addition, second collapsible frame 460 comprises two curved structural members 462 and 464 that are joined together using a second flexible joint 466.

In other alternate embodiments, a number of different types of structural members 422, 424, 462, and 464 could be used. In addition, a number of different types of flexible joints 426 and 466 could be used for joining the structural members together to establish collapsible frames 420 and 460.

In the third alternate embodiment, protective coverings 430 and 470 comprise metalized cloth that provides EMI protection. In other alternate embodiments, protective coverings 430 and 470 could comprise any number of different materials that provide other forms of protection such as protection from moisture.

In the third alternate embodiment, protective covering 430 is attached to first collapsible frame 420 using a number of snaps. In addition, protective covering 470 is attached to second collapsible frame 460 using snaps. Frames 420 and 460 provide means for supporting protective coverings 430 and 470 without damaging them.

The frames are made large enough so that the protective covering does not contact the subassembly that is being covered. In this manner, valuable assets such as satellite payloads can be protected from environmental conditions. In addition, the two sections can easily be separated to provide access to the subassembly being protected.

In the third alternate embodiment, structural members can be rotated together for easier storage. In this case, the protective coverings remain attached to the structural members, and they can be folded for easier storage.

In other alternate embodiments, structural members 422, 424, 462, and 464 could comprise a number of pieces that are connected together using various methods. In this way, structural members 422, 424, 462, and 464 could be easily assembled and/or disassembled.

In other alternate embodiments, at least one mobility arrangement is provided. A mobility arrangement is a device that allows first portable section 410 and second portable section 450 to be easily moved once they are unfolded. A mobility arrangement can include wheels and/or skid plates and can be attached to end points on first portable section 410 and second portable section 450. In other alternate embodiments, a set of mounting hardware could be used.

Figure 5:
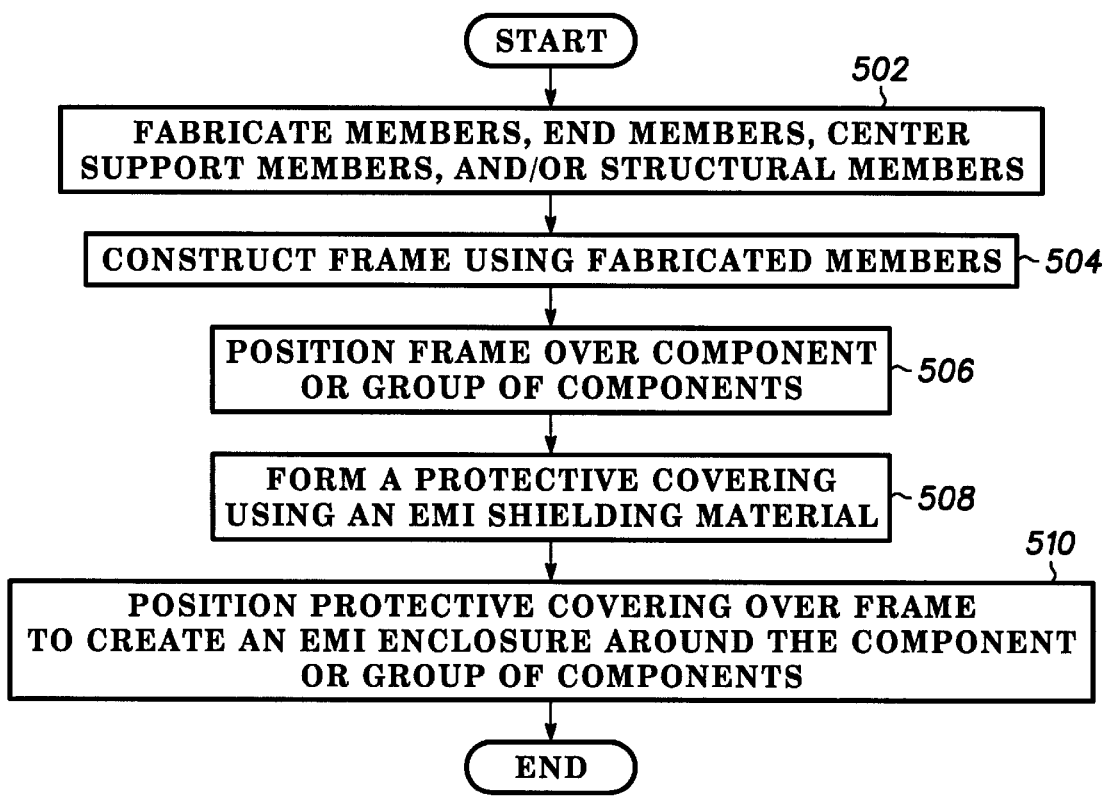
FIG. 5 illustrates a method of using a protective shield tent in a manufacturing process in accordance with a preferred embodiment of the invention.

FIG. 5 illustrates a method of using a protective shield tent in a manufacturing process in accordance with a preferred embodiment of the invention. Procedure 500 describes a method of using an enclosure for providing EMI protection, among other things, for at least one component attached to a mounting plate.

In step 502, a number of members are fabricated. Members can include end members, center support members and/or structural members.

In step 504, the various members are used to construct a frame. Some of the members are connected to each other using a lacing material, although this is not required for this invention.

In step 506, the frame is positioned over a component or a group of components. Desirably, the members do not move relative to each other after the frame has been constructed, and this allows the frame to be easily moved from one location to another.

In step 508, a protective covering is formed using at least one piece of metallic foil having a polyester backing material. The metallic foil provides an EMI shield layer. Desirably, the frame has a known shape that allows a protective covering to be formed which conforms to the known shape.

In step 510, the protective covering is put in place over the frame. Desirably, the protective covering is attached to a mounting plate using at least one mounting device that provides a low resistance path from the protective shield tent to the mounting plate.

In this manner, a relatively permanent protective shield tent is created around a component or a group of components. In a preferred embodiment, the protective shield tent becomes part of the flight hardware. The protective shield tent forms a thermal barrier.

Figure 6:
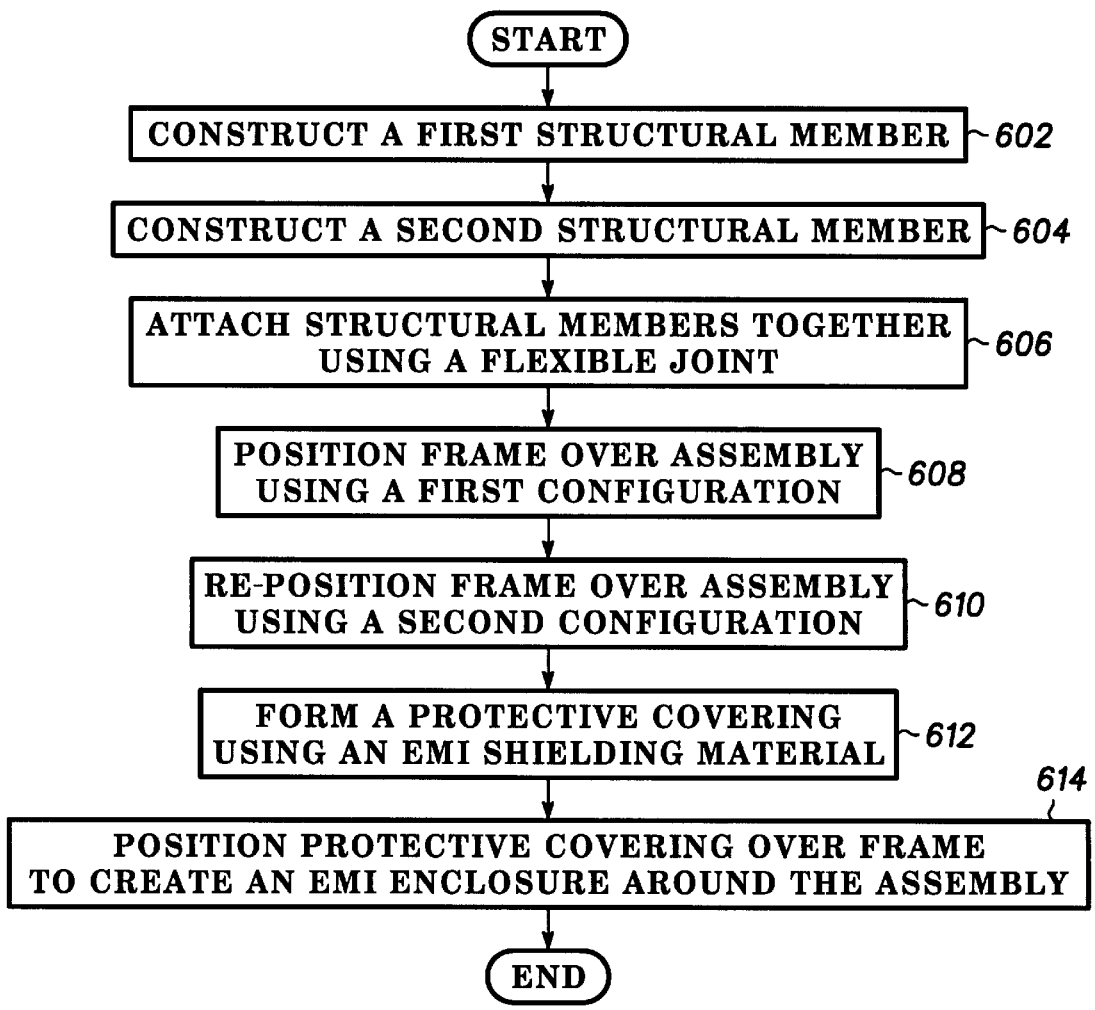
FIG. 6 illustrates a method of using a protective shield tent in a manufacturing process in accordance with a first alternate embodiment of the invention.

FIG. 6 illustrates a method of using a protective shield tent in a manufacturing process in accordance with a first alternate embodiment of the invention. Procedure 600 describes a method of using a portable enclosure for providing EMI protection, among other things, for a large subassembly. In this manufacturing process, the protective shield tent is larger than the subassembly it is protecting. Desirably, a collapsible frame is fabricated around the large subassembly, and a protective covering is positioned over the collapsible frame.

In step 602, a first structural member is constructed using a first group of pole pieces. This step could include unfolding a collapsible member.

In step 604, a second structural member is constructed using a second group of pole pieces. This step could also include unfolding a collapsible member.

In step 606, the first structural member and the second structural member are attached together using a flexible joint. The flexible joint allows the first structural member and the second structural member to move in at least one dimension with respect to each other. The flexible joint allows the two structural members to be positioned relative to each other once they have been joined together to form the collapsible frame. This allows the collapsible frame to have at least two configurations. Desirably, the flexible joint allows the two structural members to rotate with respect to each other. A first configuration can be used when the protective shield tent is being setup, or it can also be used when the assembled frame must be stored. A second configuration is used when the protective shield tent is deployed.

In step 608, a collapsible frame is positioned over the subassembly. In this case, the collapsible frame is in a first configuration. This means that the first structural member and the second structural member are in a substantially side-by-side position.

In step 610, the collapsible frame is re-positioned into a second configuration over the subassembly. This is accomplished by rotating the first structural member and the second structural member so that a first plane defined by the first structural member is substantially perpendicular to a second plane defined by the second structural member.

In step 612, a protective covering is formed using at least one piece of metallic foil having a polyester backing material. The metallic foil provides an EMI shield layer. The protective covering is shaped to substantially conform to a shape formed by the collapsible frame in the second configuration.

In step 614, the protective covering is put in place over the frame. Desirably, the protective covering is attached to the frame using at least one attachment device that provides a low resistance path from the at least one piece of metallic foil to the frame.

In this manner, a protective shield tent is created around the subassembly.

In other cases, one or more separation devices could be used to connect the frame to the subassembly. In this way, the separation device establishes a clearance region between the frame and the subassembly. This also allows the subassembly and the protective shield tent to be moved together.

In some cases, at least one mobility arrangement is attached to the collapsible frame. The mobility arrangement allows the collapsible frame to be easily moved over a substantially smooth flat surface while maintaining a low resistance grounding path from the frame to the surface.

A protective shield tent can be used to provide a permanent method for protecting components and/or subassemblies. A protective shield tent is light weight and can be fabricated around components and/or subassemblies. The protective shield tent is simple to use and shortens the time required for a manufacturing process. The protective shield tent can easily be permanently attached, and in this way, it becomes a part of the subassembly it is protecting.

A protective shield tent can also be used to provide a portable and repeatable method for protecting subassemblies during various stages of a manufacturing process. The protective shield tent is light weight and can be deployed manually. In addition, the protective shield tent can easily be moved from one location to another facilitating re-use.

The invention has been described above with reference to a preferred embodiment. However, those skilled in the art will recognize that changes and modifications can be made in this preferred embodiment without departing from the scope of the invention. For example, a number of different alternate embodiments have been identified herein, and these can be organized differently than described herein while achieving equivalent results.

What is claimed is:

1. A portable EMI shielding apparatus for providing a protective enclosure for a component of a satellite payload, during the manufacturing of said component, when said component is attached to a mounting plate, said portable EMI shielding apparatus comprising:

a portable, collapsible frame comprising at least two curved members and at least one straight member coupled to each other, said portable, collapsible frame further comprising means for being configured into a first shape to fit over said component and means for being mounted on said mounting plate; and a protective covering comprising metallic foil, said protective covering further comprising a plurality of shaped panels that allow said protective covering to be positioned over said portable, collapsible frame when said portable, collapsible frame is configured into said first shape about said component, said protective covering further comprising means for being attached to said mounting plate, and said protective covering further comprising at least one attachment device for attaching said protective covering to said portable, collapsible frame, thereby preventing said protective covering from touching said component.

2. A protective shield tent for providing a portable EMI shield for a satellite payload during a step in the manufacturing process of said satellite payload, said protective shield tent comprising:

a collapsible frame comprising an electrically conductive first curved structural member, a second curved structural member, and a flexible joint, said collapsible frame being manually configurable into at least two shapes, wherein a first shape is used during storage and a second shape is used during deployment; and a protective covering comprising a plurality of shaped panels, said plurality of shaped panels further comprising means for attaching said plurality of shaped panels to said collapsible frame and means for connecting said plurality of shaped panels into a substantially domed shape which is positioned over said collapsible frame when said collapsible frame is configured into said second shape, thereby deploying said protective shield tent about said satellite payload and protecting said satellite payload from environmental conditions while said satellite payload is on a factory floor.

3. The protective shield tent as claimed in claim 2, wherein said structural members further comprise at least one curved rod and at least one straight rod which have mating ends.

4. The protective shield tent as claimed in claim 2, wherein said means for attaching said plurality of shaped panels to said collapsible frame comprises at least one attachment device comprising a snap mechanism.

5. The protective shield tent as claimed in claim 2, said protective shield tent further comprising at least one mobility arrangement for allowing said collapsible frame to move from one location to another location.

6. The protective shield tent as claimed in claim 5, wherein said at least one mobility arrangement comprises at least one wheel.

7. The protective shield tent as claimed in claim 5, wherein said at least one mobility arrangement comprises at least one skid plate which provides a ground path.

8. The protective shield tent as claimed in claim 2, wherein said protective covering comprises plastic material.

9. The protective shield tent as claimed in claim 2, wherein said protective covering comprises metallic foil material.

* * * * *